(12) United States Patent
Ali

(10) Patent No.: US 6,933,628 B2
(45) Date of Patent: Aug. 23, 2005

(54) HIGH SPEED CHANNEL SELECTOR SWITCH

(75) Inventor: Mohammed Ershad Ali, Sunnyvale, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 139 days.

(21) Appl. No.: 10/627,317

(22) Filed: Jul. 24, 2003

(65) Prior Publication Data
US 2005/0016823 A1 Jan. 27, 2005

(51) Int. Cl.⁷ .......................... H01H 19/58; H04L 1/12; H04L 12/50
(52) U.S. Cl. .................. 307/112; 200/11 R; 361/681; 361/686; 370/357
(58) Field of Search ................. 200/2, 3, 11 R–11 TW, 200/303; 370/351–367, 464–545, 67; 361/681–683, 685, 686, 781, 837; 379/24

(56) References Cited

U.S. PATENT DOCUMENTS

| | | | | |
|---|---|---|---|---|
| 3,470,333 A | * | 9/1969 | Schneider et al. | .... 200/11 G X |
| 3,855,521 A | * | 12/1974 | Kiuchi | ................. 200/11 G X |
| 4,139,817 A | * | 2/1979 | Boer et al. | ............ 200/11 G X |
| 4,837,413 A | * | 6/1989 | Schwab et al. | ........... 200/11 R |
| 5,153,391 A | * | 10/1992 | Dzung et al. | ............. 200/11 R |

FOREIGN PATENT DOCUMENTS

| JP | 068549 | 3/1992 |
|---|---|---|
| JP | 311351 | 10/2002 |

* cited by examiner

Primary Examiner—James R. Scott

(57) ABSTRACT

An embodiment in accordance with the invention recites a high speed channel selector switch. The high speed channel selector switch includes a first unit that has a plurality of contacts that are operable to electrically couple to a plurality of high speed data lines of a device under test. The first unit also has an additional contact operable to electrically couple to a signal line. The high speed channel selector switch further includes a second unit that is operable to selectively electrically couple one of the plurality of contacts of the first unit to the additional contact of the first unit. The second unit also electrically couples the remaining contacts of the first unit to respective termination impedances. Thus, one of the plurality of high speed data lines is coupled to the signal line via the second unit and the remaining high speed data lines are coupled to respective termination impedances.

21 Claims, 7 Drawing Sheets

HIGH SPEED CHANNEL SELECTOR SWITCH

TECHNICAL FIELD

Embodiments of the invention are related to the field of high speed communications. More specifically, embodiments of the invention are directed to test equipment for high speed communication systems.

BACKGROUND ART

Massively parallel high speed optoelectronic systems can have tens or even hundreds of channels, each working at up to 10 Gigabits per second. A typical system comprises either a receiver module or a transmitter module. FIG. 1 shows a top view of an exemplary prior art optoelectronic module 100 fabricated within an integrated circuit (IC) 110. The module 100 has an array of vertical cavity surface emitting lasers (VCSELs) 120 and a large number of high speed pads 130 disposed around the periphery of the IC 110. For clarity, not all of the high speed pads 130 are shown. Other pads such as supply pads and ground pads (not shown) are also typically disposed around the periphery of the IC 110. Typically, there are a total of 5 pads per channel, two pads are high speed pads 130 for electrical signal transmission, two pads are for power supply, and one pad is for ground. When optoelectronic module 110 is used as a receiver, VCSELs are replaced by photodetectors. For both receiver and transmitter, an additional optical subassembly that includes coupling and focusing optics and optical mulitplexers or demultiplexers reside on top of the VCSELs or photodetectors.

FIG. 2 illustrates an exemplary prior art evaluation board 200 used to test massively parallel optoelectronic modules. In FIG. 2, module 100 is placed on the evaluation board 200 and the individual high speed pads (e.g., high speed pads 130 of FIG. 1) are coupled via data lines 210 to a plurality of connectors 220. The connectors 220 are coupled via data cables 230 to either an evaluation tool such as a signal tester) or to a termination impedance 250.

Evaluating high speed optoelectronic systems present significant problems. For a massively parallel system, a manual evaluation system employing discrete connectors, cables and terminations requires a lengthy measurement session. Such systems are typically evaluated one or a few channels at a time in a process that involves tediously disconnecting and connecting the data cables 230. Because commercially available evaluation tools (e.g., evaluation tool 240) typically only allow a few inputs at a time, only a few channels of the device under test are connected at any given time to the evaluation tool. The rest of the channels are terminated by manually connecting each and every one of the rest of the connectors 220 to a suitable termination impedance 250. This results in a very tedious and time-consuming evaluation process involving repeatedly connecting and disconnecting cables manually. Additionally, accommodating all of these discrete components on an evaluation board results in a very large test platform that occupies an excessive amount of table-top space. Another disadvantage is that it is very expensive to purchase all of the high speed components necessary to build a conventional test platform.

Not only is the evaluation process tedious, but it is error prone. Since the connecting/disconnecting is all done manually, it is quite possible that one or more channels could be improperly terminated, resulting in an error in measurement. Furthermore, the constant connecting and disconnecting of leads causes wear of the connectors 220. Such connector wear can cause the connectors 220 to eventually fail to properly transmit the signal to module 100 and hence be an additional source of errors.

SUMMARY OF THE INVENTION

A high speed channel selector switch that selectively couples one of a plurality of data lines of a device under test to a signal line in accordance with the invention is disclosed. The remaining data lines of the device under test are concurrently coupled to respective termination impedances disposed within the switch. This facilitates evaluating high speed communication devices, such as massively parallel optoelectronic systems by reducing the necessity for manually connecting the data lines individually to an evaluation tool and for terminating the remaining data lines.

BRIEF DESCRIPTION OF THE DRAWINGS

The accompanying drawings, which are incorporated in and form a part of this specification, illustrate embodiments of the invention and, together with the description, serve to explain the principles of the invention. Unless specifically noted, the drawings referred to in this description should be understood as not being drawn to scale.

DETAILED DESCRIPTION OF THE INVENTION

Embodiments in accordance with the invention provide a switch for selectively coupling a signal line with a selected one of a plurality of data lines of an evaluation board. The switch enables a user to select one of the data lines for testing while simultaneously terminating the remaining data lines. This facilitates rapidly connecting and disconnecting leads when testing/evaluating high speed communication devices such as massively parallel optoelectronic systems. Additionally, the amount of wear exhibited in the operation of conventional evaluation boards is reduced. Further, embodiments in accordance with the invention reduce the likelihood of erroneously connecting or terminating leads that is possible when done manually.

Figure 3:
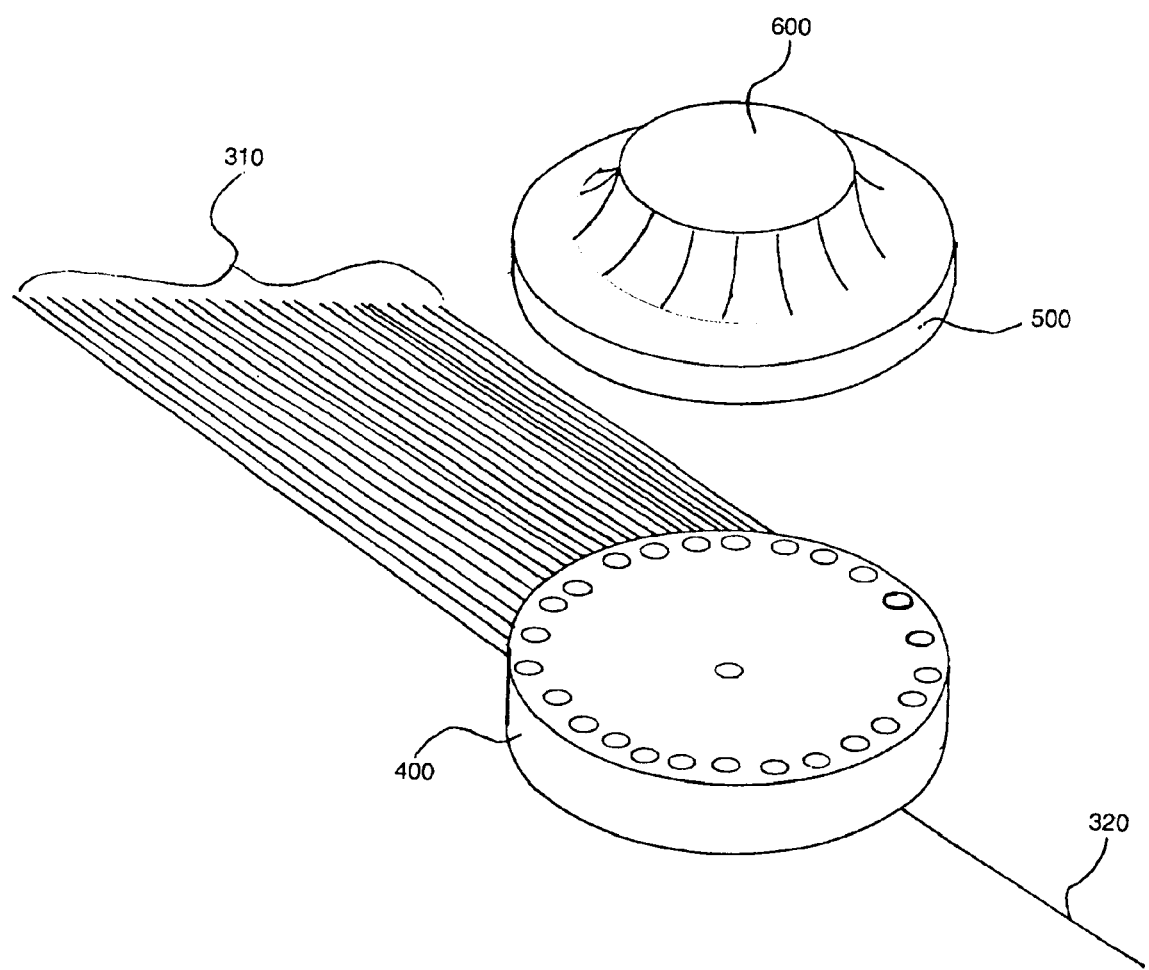
FIG. 3 illustrates a high speed channel selector switch in accordance with one embodiment of the invention.

With reference to FIG. 3, a perspective view is shown of the high speed channel selector switch 300 of the invention.

The following discussion will begin with a description of the physical structure in accordance with the invention. This discussion will then be followed with a description of the operation of embodiments in accordance with the invention. With respect to the physical structure of the invention, FIG. 3 illustrates a high speed channel selector switch 300 in accordance with embodiments in accordance with the invention. In one embodiment, switch 300 comprises a fixed unit 400, that is coupled with a plurality of high speed data lines 310. In an embodiment, the high speed data lines convey signals to the high speed pads of a massively parallel optoelectronic module that is being tested. As discussed above, massively parallel high speed optoelectronic systems can have tens or even hundreds of channels, each working in the range of approximately 10 Gigabits per second or greater. However, embodiments in accordance with the invention can convey a wide range of signals, for example, from a direct current signal to over 10 Gigabits per second. Fixed unit 400 is also coupled with a signal line 320 that conveys electrical signals to or from an evaluation device such as a signal tester (not shown). High speed channel selector switch 300 further comprises a rotatable unit 500, that is disposed above fixed unit 400. Rotatable unit 500 is used to selectively couple one of the high speed data lines 310 to the signal line 320. In other words, an electrical signal to or from a signal tester or another source is selectively passed between signal line 320 and one of the high speed data lines 310 via the rotatable unit 500. Rotatable unit 500 also comprises a plurality of contacts that couple the remaining high speed data lines to respective termination impedances. In an embodiment, the termination impedances are disposed within rotatable unit 500 itself. Thus, one of the plurality of high speed data lines is selectively coupled to the signal line via the fixed unit 400 and the rotatable unit 500 while the remaining high speed data lines are coupled to respective termination impedances. To select a particular high speed data line for testing, rotatable unit 500 is rotated until the desired high speed data line 310 is selectively coupled with the signal line 320.

In the embodiment of FIG. 3, high speed channel selector switch 300 further comprises a knob 600 that facilitates turning rotatable unit 500. In embodiments in accordance with the invention, knob 600 has index marks on its top surface or some other markings to assist a user in determining which of the high speed data lines 310 is selectively coupled with signal line 320.

Figure 4A:
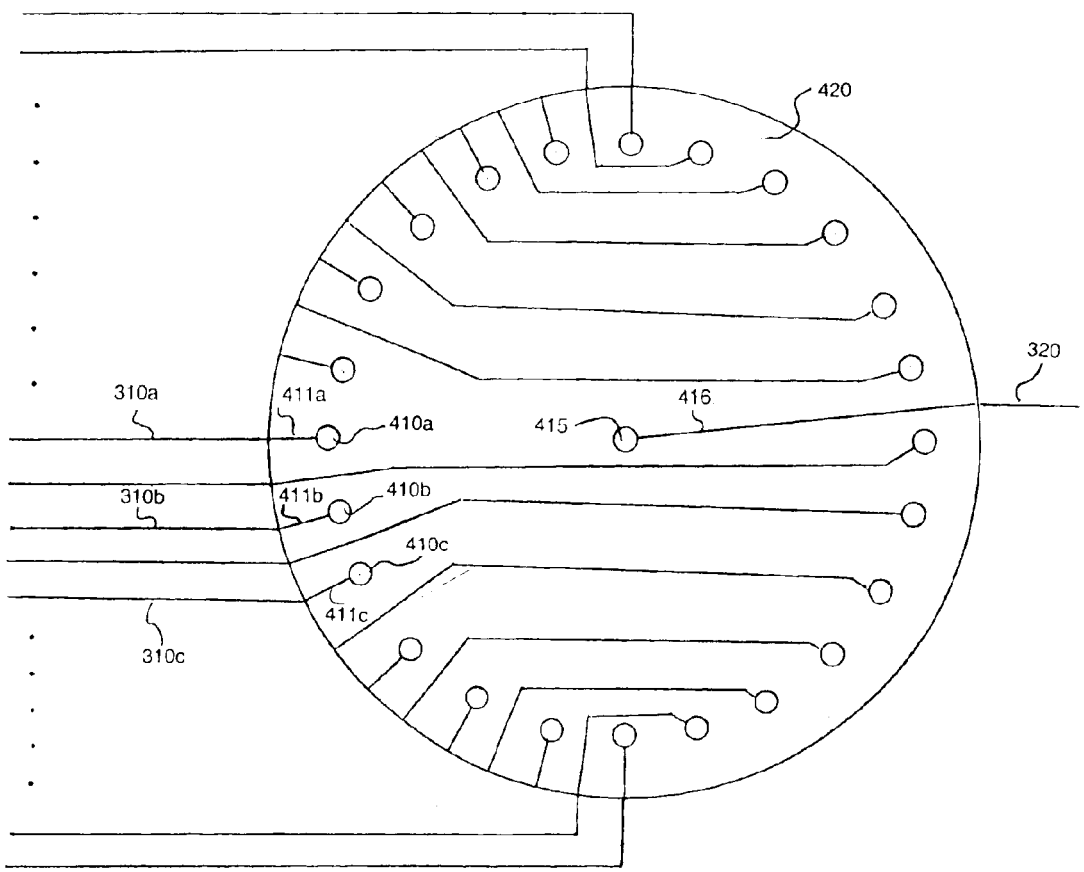
FIGS. 4A and 4B are top and side sectional views respectively of electrical paths in a fixed unit of a high speed channel selector switch in accordance with one embodiment of the invention.
Figure 4B:
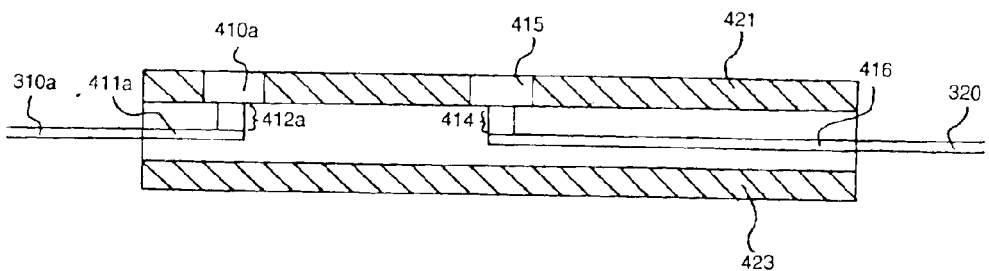

FIGS. 4A and 4B are top and side sectional views respectively of electrical paths in a fixed unit 400 of a high speed channel selector switch (e.g., high speed channel selector switch 300 of FIG. 3) in accordance with embodiments of the invention. In embodiments in accordance with the invention, fixed unit 400 is coupled with an evaluation board. However, fixed unit 400 can also be embedded within an evaluation board.

In an embodiment in accordance with the invention shown in FIG. 4A, fixed unit 400 comprises 24 outer high speed pads typically shown as 410a, 410b, and 410c disposed in a circular pattern upon a substrate 420. While the embodiment of FIG. 4A shows the outer high speed pads disposed in a circular pattern, embodiments in accordance with the invention are well suited to have the high speed pads disposed in a different manner. Similarly, while substrate 420 is shown in FIG. 4A to be configured as a circular structure, embodiments in accordance with the invention are well suited to substrate structures having other shapes as well. Each of the 24 outer high speed pads is electrically coupled to a respective high speed data line typically shown as 310a, 310b, and 310c via a respective signal input/output line typically shown as 411a, 411b, and 411c. For example, referring now to FIG. 4B, contact 412a couples outer high speed pad 410a to signal input/output line 411a. In an embodiment in accordance with the invention, substrate 420 is a disk shaped circuit board made of a microwave substrate material such as Alumina. While embodiments in accordance with the invention discussed specifically recite Alumina, other materials, such as glass ceramics, various PTFE composites and non-PTFE laminates, etc can be used for substrate 420.

In FIG. 4A, fixed unit 400 further comprises an additional high speed pad (e.g., signal pad 415) that is disposed proximate to the center of substrate 420. Signal pad 415 is electrically coupled to a signal line (e.g., signal line 320 of FIG. 3) via a signal input/output line 416.

FIG. 4B is a side sectional view of fixed unit 400 taken through signal input/output line 416, signal pad 415, outer high speed pad 410a, and signal input/output line 411a. In FIG. 4B, signal pad 415 is electrically coupled with signal line 320 via contact 414 and with signal input/output line 416. Additionally, high speed pad 410a is coupled with high speed data line 310a through via 412a and signal input/output line 411a. Not shown in FIG. 4B are contacts which electrically couple the top ground region 421 with bottom ground region 423. Additionally, while top ground region 421 appears to be multiple sections in the side perspective of FIG. 4B, in one embodiment in accordance with the invention, the top ground region 421 is one continuous region. In other embodiments in accordance with the invention, conductive balls are attached to signal pad 415, each of the outer high speed pads 410, and the top ground region 421 in order to provide an electrically conductive path between the fixed unit 400 and the rotatable unit 500.

Figure 5A:
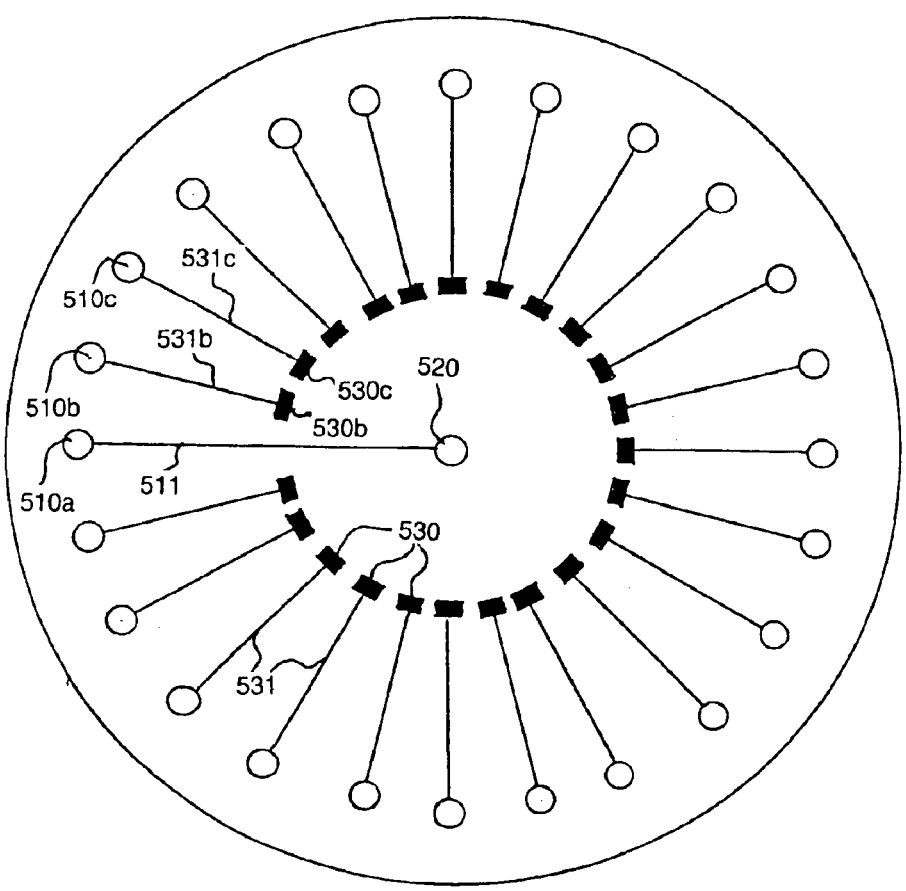
FIGS. 5A and 5B are bottom and side sectional views respectively of electrical paths in a rotatable unit of a high speed channel selector switch in accordance with one embodiment of the invention.
Figure 5B:
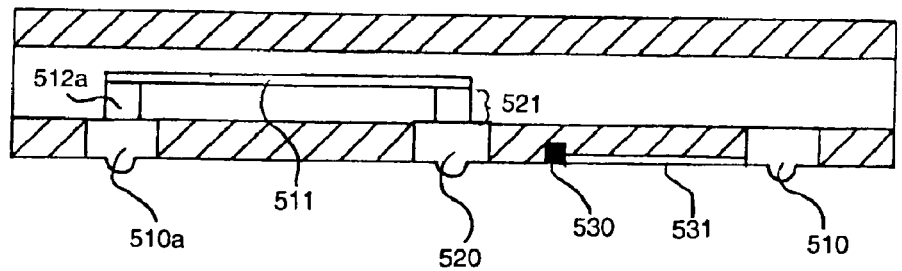

FIGS. 5A and 5B are bottom and side sectional views respectively of rotatable unit 500 of a high speed channel selector switch in accordance with the invention. In FIG. 5A, the bottom surface of rotatable unit 500 comprises 24 outer high speed pads typically shown as 510a, 510b, and 510c disposed in a circular pattern near the outer edge of rotatable unit 500. Again, while FIG. 5A shows the outer high speed pads 510 disposed in a circular pattern, embodiments in accordance with the invention are well suited to have the high speed pads disposed in a different manner. Rotatable unit 500 further comprises a central high speed pad 520 that is disposed proximate to the center of rotatable unit 500. Referring now to FIG. 4A as well as to FIG. 5A, the outer high speed pads 410 of the fixed unit 400 are configured in a matching pattern with reference to the outer high speed pads 510 of rotatable unit 500. Thus, when fixed unit 400 and rotatable unit 500 are mated (i.e. the bottom surface of rotatable unit 500 and the top surface of fixed unit 400 are in contact) and are properly aligned, each of the outer high speed pads 410 is aligned with and electrically coupled to a corresponding outer high speed pad 510. Hence, an electrical signal can be conveyed between each of the outer high speed pads 410a, 410b, 410c, etc., to a corresponding outer high speed pad 510a, 510b, 510c, etc. As a result, a significant savings in the amount of time required to perform a measurement is achieved. Also, the use of the high-speed channel selector switch enables implementation of a more compact and robust evaluation platform. Due to fewer measurement errors and less mechanical wear of the evaluation equipment, the accuracy of measurement is enhanced.

Additionally, central high speed pad 520 is aligned with signal pad 415 of FIG. 4A. In FIG. 5A, one of the outer high speed pads 510a, 510b, 510c (e.g., outer high speed pad 510*a*) is electrically coupled with central high speed pad 520 via signal line 511 and contact 512*a*. Central high speed pad 520 is coupled with signal line 511 via contact 521. In an embodiment in accordance with the invention, the width, thickness, and material comprising signal line 511 are selected to control the impedance characteristics of signal line 511. In other embodiments of the invention, the termination impedance could be a low parasitic surface-mount or flip-chip component mounted on the rotatable unit. The termination impedance can also reside on the fixed unit or external to the switch, in which case routing lines should be established from the pads of the rotatable unit to the pads of the termination impedances. Additionally, the remaining outer high speed pads of rotatable unit 500 (i.e., those pads not electrically coupled to central high speed pad 520) are electrically coupled with respective termination impedances typically shown as 530 via a respective terminating line 531 typically shown as 531*b*, 531*c*, etc. In an embodiment in accordance with the invention, the termination impedances 530 are embedded within rotatable unit 500 and have low parasitics.

IN OPERATION

The following sets forth in detail the operation of embodiments in accordance with the invention. As shown in FIG. 3, FIG. 4, and FIG. 5, a user can selectively couple a high speed data line 310 with signal line 320 using rotatable unit 500 in conjunction with fixed unit 400. For example, a user can turn rotatable unit 500 until an electrical path is formed between outer high speed pad 410*a* and signal pad 415 via outer high speed pad 510*a*, signal line 511, and central high speed pad 520. Additionally, the remaining high speed data lines 310 are coupled with a termination impedance 530. The user can select outer high speed pad 410*b* by turning rotatable unit 500 counterclockwise relative to fixed unit 400 (e.g., using knob 600 of FIG. 3) until high speed pad 510*a* is aligned with and electrically contacts outer high speed pad 410*b*. In so doing, signal line 511 now couples outer high speed pad 410*b* and signal pad 415, and outer high speed pad 410*a* is now coupled with a termination impedance 530. Thus, a user can quickly switch channels while simultaneously terminating the remaining high speed channels.

Figure 6:
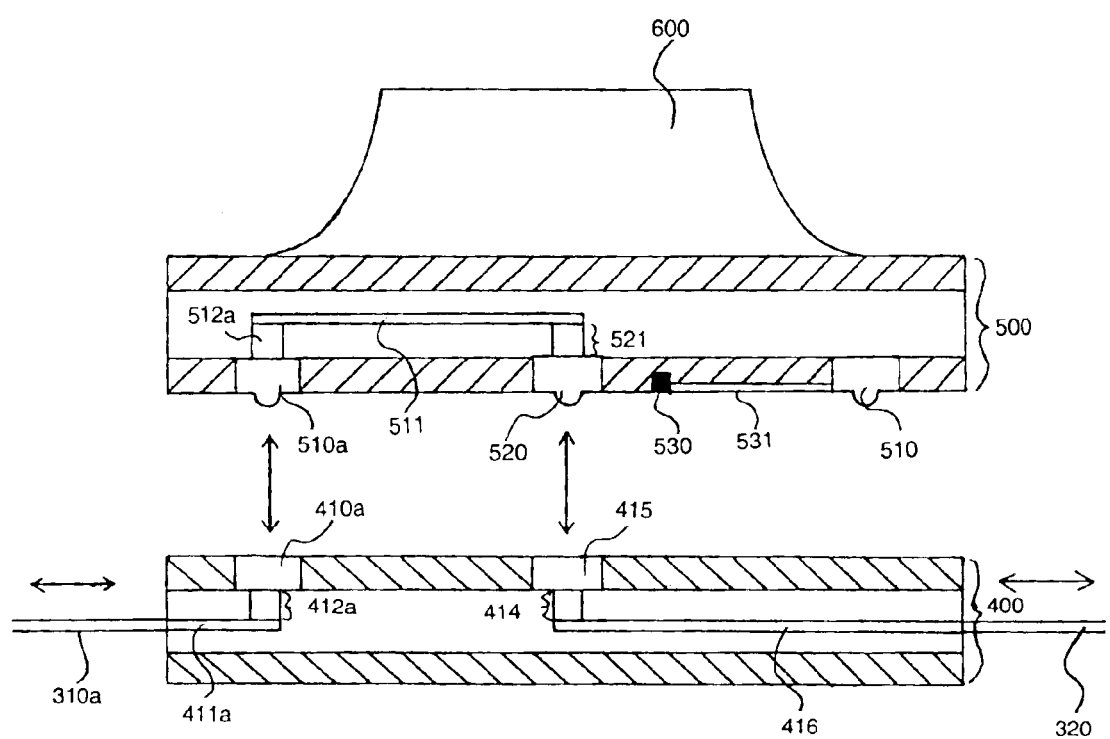
FIG. 6 is a side section view of an electrical path conducted by a fixed unit and a rotatable unit of a high speed channel selector switch in accordance with one embodiment of the invention

FIG. 6 is a side section view of an electrical path conducted by a fixed unit 400 and a rotatable unit 500 of a high speed channel selector switch (e.g., high speed channel selector switch 300 of FIG. 3) in accordance with one embodiment of the invention. It is appreciated that FIG. 6 shows the side section views of fixed unit 400 and rotatable unit 500 (FIGS. 4B and 5B respectively). In the following discussion it is assumed that an electrical signal is being sent from an evaluation device (not shown) to an optical channel of an optoelectronic module (not shown). In another implementation, a signal is being sent from an optoelectronic module to the evaluation device.

In FIG. 6, an electrical signal from an evaluation device (e.g., a signal generator) is conveyed from signal line 320 to signal pad 415 via contact 414 and is then conveyed to central high speed pad 520. From central high speed pad 520, the electrical signal is passed to signal line 511 and high speed pad 510 via contact 521. From there the electrical signal is conveyed to data line 310*a* through high speed pad 410*a*, contact 412*a*, and signal input/output line 411*a*.

In another embodiment in accordance with the invention, a plurality of signals may be simultaneously conveyed from an optoelectronic module to fixed unit 400 via a plurality of data lines (e.g., data lines 310 of FIG. 3). However, only one of these signals is electrically coupled to signal line 320 via rotatable unit 500. The remaining electrical signals are coupled with respective termination impedances (e.g., termination impedance 530 of FIG. 5A) via remaining high speed pads 510 and the terminating transmission lines 531 (e.g. high speed pad 510*b* and terminating transmission line 531*b*). A user can select which of the plurality of signals is coupled to signal line 320 by turning knob 600 as described above.

Figure 7:
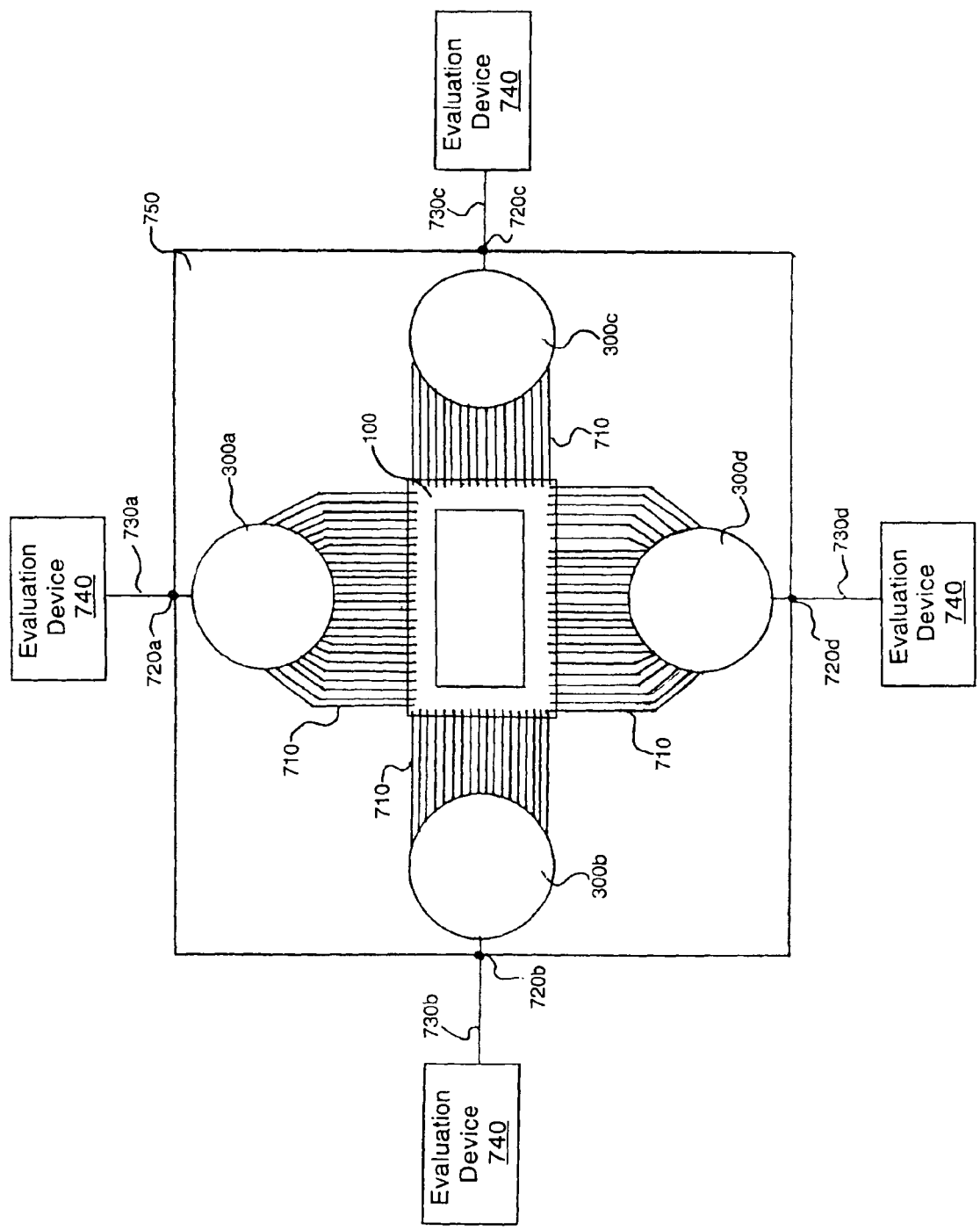
FIG. 7 is a top view of an evaluation board for testing a massively parallel optoelectronic module in accordance with one embodiment of the invention.

FIG. 7 is a top view of an evaluation board 700 for testing a massively parallel optoelectronic module in accordance with embodiments of the invention. In the embodiment of FIG. 7, a plurality of high speed channel selector switches typically shown as 300*a*, 300*b*, 300*c*, and 300*d* are coupled with a plurality of high speed data lines 710. The electrical paths shown in FIGS. 4A and 4B reside in fixed units of the high speed channel selector switches 300*a*–300*d*. In one embodiment, the high speed channel selector switches 300*a*–300*d* are coupled with a substrate 750 of evaluation board 700. However, the electrical paths shown in FIGS. 4A and 4B may, in accordance with embodiments of the invention, be fabricated within the substrate of evaluation board 700.

Figure 1:
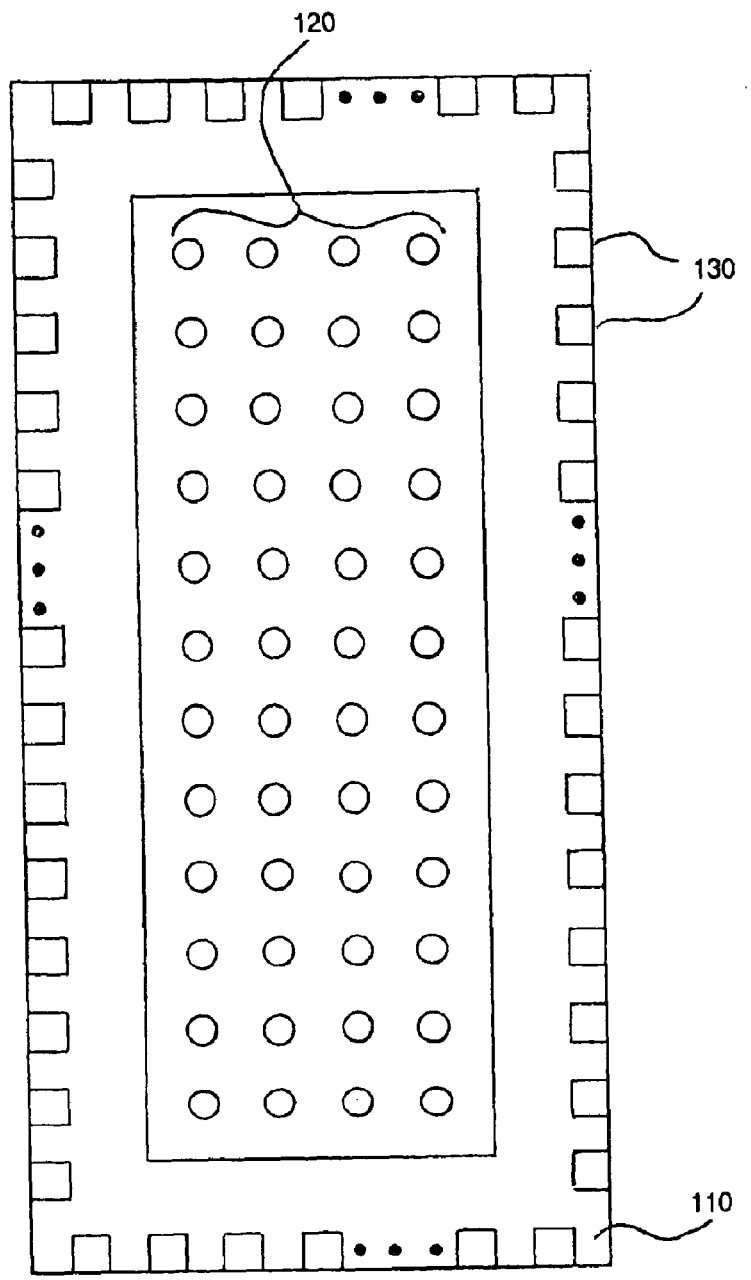
FIG. 1 is a top view of an exemplary prior art massively parallel optoelectronic module.
Figure 2:
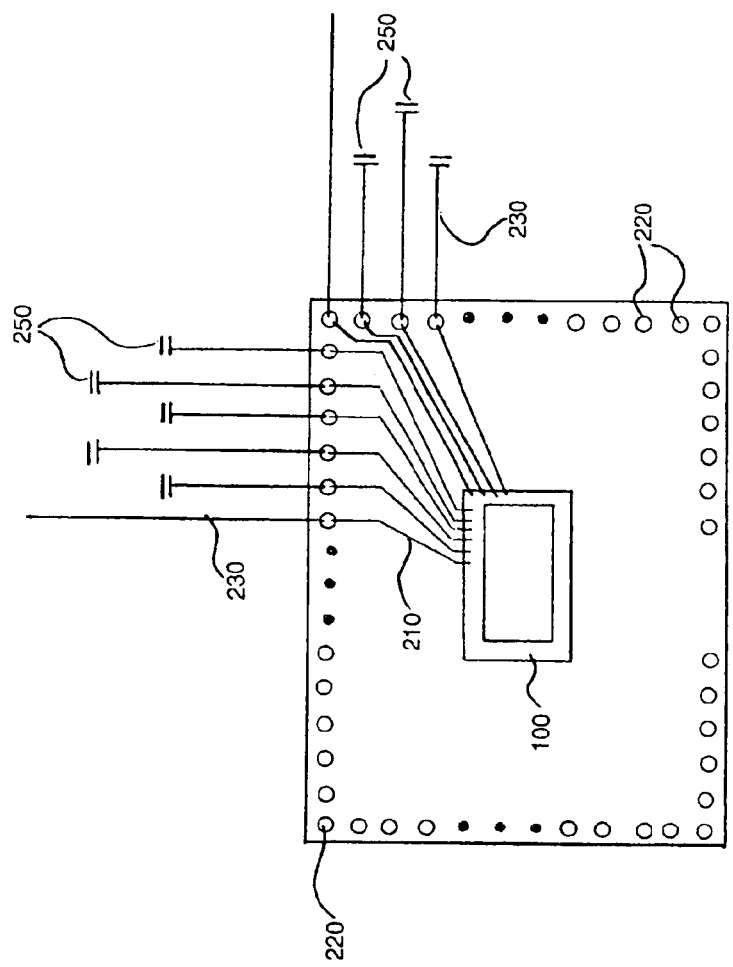
FIG. 2 is a top view of an exemplary prior art evaluation board used to test massively parallel optoelectronic modules.

An optoelectronic module 100 is electrically coupled with the high speed data lines 710. In one embodiment, optoelectronic module 100 is a massively parallel high speed optoelectronic system. In FIG. 7, optoelectronic module 100 is a receiver and has 96 high speed pads (e.g., high speed pads 130 of FIG. 1) that serve as electrical signal outputs from a receiver integrated circuit that amplifies and/or processes the analog signals from a photodetector array. Alternatively, the optoelectronic module 100 is a transmitter, in which case the high speed pads serve as electrical signal inputs of a transmitter integrated circuit which drives a VCSEL array. Each of the high speed pads of the optoelectronic module 100 is coupled to one of the high speed channel selector switches 300*a*–300*d* through an individual high speed data line 710. The electrical coupling between the high speed pads of optoelectronic device 100 and the high speed data lines 710 is formed in any convenient fashion. In one embodiment of the invention, individual wire bonds are formed between the high speed pads of the optoelectronic module 100 and the high speed data lines 710.

Still referring to FIG. 7, each high speed channel selector switch 300*a*–300*d* has a signal pad (e.g., signal pad 415 of FIGS. 4A and 4B). The signal pads electrically couple to connectors 720*a*–720*d* via respective signal lines (e.g., signal line 320 of FIG. 3). The signal pads also electrically couple to one of the high speed data lines 710 via signal input/output data lines, high speed pads, and signal lines as described above. A cable 730*a*, 730*b*, 730*c*, or 730*d* electrically couples one of the high speed channel selector switches 300*a*–300*d* with a respective evaluation device 740.

Embodiments in accordance with the invention add a level of integration in the evaluation of massively parallel systems. The invention facilitates quickly switching between channels when testing massively parallel high speed optoelectronic modules. Additionally, the remaining channels are concurrently coupled with a termination impedance. As a result, significant savings in time to perform a measurement is achieved. Because embodiments in accordance with the invention eliminate the need to manually connect and/or terminate individual cables in evaluation board 700, less physical degradation of the connectors (e.g., connectors 720*a*–720*d* of FIG. 7) occurs. As a result, fewer measurement errors and less mechanical wear of the evaluation equipment occurs and the accuracy of measurement is enhanced. The use of the high-speed channel selector switch also enables implementation of a more compact and robust evaluation platform.

While the invention has been described in particular embodiments, it should be appreciated that the invention should not be construed as limited by such embodiments, but rather construed according to the following claims.

What is claimed is:

1. A high speed channel selector switch comprising:
   a first unit comprising a plurality of contacts operable to electrically couple to a plurality of high speed data lines of a device under test, said first unit further comprising a signal contact operable to electrically couple to a signal line; and
   a second unit operable to selectively electrically couple one of said plurality of contacts to said signal contact and further electrically couple remaining ones of said plurality of contacts to a plurality of respective termination impedances such that one of said plurality of high speed data lines is coupled to said signal line and remaining ones of said plurality of high speed data lines are coupled to said plurality of respective termination impedances.

2. The high speed channel selector of claim 1, wherein said second unit rotates relative to said first unit.

3. The high speed channel selector of claim 1, wherein said plurality of contacts are configured in a circle.

4. The high speed channel selector of claim 3, wherein said signal contact is located in the center of said circle.

5. The high speed channel selector of claim 1, wherein one of a plurality of input channels is selectable.

6. The high speed channel selector of claim 1, wherein one of a plurality of output channels is selectable.

7. The high speed channel selector of claim 1, wherein said first unit is operable to be fixed to an evaluation board.

8. The high speed channel selector switch of claim 1, wherein said plurality of respective termination impedances is disposed within said second unit.

9. An evaluation board comprising:
   a plurality of high speed data lines operable to couple to high speed channels of a device under test;
   a high speed connector; and
   at least one high speed channel selector switch comprising:
   a first unit comprising a plurality of contacts electrically coupled to said plurality of high speed data lines and said first unit further comprising a signal contact electrically coupled to said high speed connector; and
   a second unit comprising a plurality of termination impedances and operable to selectively electrically couple contacts of said plurality of contacts to respective termination impedances of said plurality of termination impedances and further operable to selectively electrically couple one of said plurality of contacts to said signal contact in order to select a high speed channel.

10. The evaluation board of claim 9, wherein said second unit further comprises a through line.

11. The evaluation board of claim 9, further comprising a plurality of said high speed channel selector switches, wherein said evaluation board is operable to be used to test multiple channels simultaneously.

12. The evaluation board of claim 9, wherein said plurality of contacts are configured in a circular pattern.

13. The evaluation board of claim 12, wherein said signal contact is located in the center of said circular pattern.

14. The evaluation board of claim 9, wherein a signal from said high speed connector is routable to one of said plurality of high speed channels of said device under test.

15. The evaluation board of claim 9, wherein a single channel of said plurality of high speed channels of said device under test is routable to said high speed connector.

16. The evaluation board of claim 9, wherein said plurality of respective termination impedances is disposed within said second unit.

17. A high speed channel selector switch comprising:
   a first unit comprising a first plurality of high speed channel pads coupled to input/output lines and said first unit further comprising an additional high speed channel pad coupled to a pass-through line; and
   a second unit comprising a second plurality of high speed channel pads, wherein a first and a second of said second plurality of high speed channel pads are electrically coupled together and remaining of said second plurality of high speed channel pads are electrically coupled to termination impedances;
   wherein said first and said second of said second plurality of high speed channel pads are operable to selectively electrically couple said additional high speed channel pad to a selected one of said first plurality of high speed channel pads to select a high speed channel; and
   wherein at least one of said second plurality of high speed channel pads is operable to selectively electrically couple at least one of said first plurality of high speed channel pads to a termination impedance of said termination impedances.

18. The high speed channel selector of claim 17, wherein said first plurality of high speed channel pads are configured in a circular pattern.

19. The high speed channel selector of claim 18, wherein said additional high speed channel pad is located in the center of said circular pattern.

20. The high speed channel selector of claim 17, wherein said termination impedances are disposed within said second unit.

21. The high speed channel selector of claim 17, wherein said first unit and said second unit comprise a microwave substrate material.

* * * * *